United States Patent [19]

Tsuruoka et al.

[11] 4,226,917
[45] Oct. 7, 1980

[54] COMPOSITE JOINT SYSTEM INCLUDING COMPOSITE STRUCTURE OF CARBON FIBERS EMBEDDED IN COPPER MATRIX

[75] Inventors: Masao Tsuruoka; Hideyuki Yagi; Keiichi Morita; Keiichi Kuniya, all of Hitachi, Japan

[73] Assignee: Hitachi, Ltd., Japan

[21] Appl. No.: 895,590

[22] Filed: Apr. 12, 1978

[30] Foreign Application Priority Data

Apr. 15, 1977 [JP] Japan ................... 52-42550

[51] Int. Cl.$^2$ ............ B32B 15/14; B32B 15/20; B60M 5/00
[52] U.S. Cl. ............... 428/614; 191/33 PM; 428/634; 428/661; 428/664; 428/667; 428/675; 428/680
[58] Field of Search ............... 428/614, 634, 650, 651, 428/652, 653, 654, 660, 661, 662, 663, 665, 671, 674, 675, 926, 929, 611; 191/22 DM, 29 DM, 33 PM, 59.1, 57, 66

[56] References Cited

U.S. PATENT DOCUMENTS

| 3,395,443 | 8/1968 | Polinko, Jr. .................. 428/675 |
| 3,574,570 | 4/1971 | Gwyn, Jr. .................... 428/674 |
| 3,720,257 | 3/1973 | Beutler et al. ................ 428/614 |
| 3,821,024 | 6/1974 | Wilken et al. ................. 428/634 |
| 3,913,127 | 10/1975 | Suzuki et al. ................. 357/73 |
| 3,969,754 | 7/1976 | Kuniya et al. ................. 357/65 |
| 4,042,753 | 8/1977 | Smith ......................... 428/674 |

FOREIGN PATENT DOCUMENTS

| 1438798 | 3/1969 | Fed. Rep. of Germany ......... 191/59.1 |
| 39-28878 | 12/1964 | Japan ......................... 428/929 |
| 46-37242 | 11/1971 | Japan ......................... 191/59.1 |
| 46-7026 | 12/1971 | Japan . |
| 48-18731 | 5/1973 | Japan . |

*Primary Examiner*—L. Dewayne Rutledge
*Assistant Examiner*—Michael L. Lewis
*Attorney, Agent, or Firm*—Craig & Antonelli

[57] ABSTRACT

A composite joint system is disclosed in which a composite structure containing carbon fibers embedded in a copper matrix in any configuration, e.g. in one direction, in random directions, in mesh form, spirally or radially is joined to another structure through a brazing material such as solder, Al brazer or Ag brazer. A film of metal such as Ni, Cr, Mo, W, Ta, Ti, Zr, V, an alloy of one or some of such metals, or the combination of some thereof is interposed between the composite structure and the brazing material. The metal film has a good wettability to both the composite structure material and the brazing material.

5 Claims, 5 Drawing Figures

COMPOSITE JOINT SYSTEM INCLUDING COMPOSITE STRUCTURE OF CARBON FIBERS EMBEDDED IN COPPER MATRIX

This invention relates to a composite joint system in which a composite structure containing carbon fibers embedded in a copper matrix is joined to another structure.

Carbon fiber has excellent characteristics such as high resistivity to heat, stress and abrasion and a small thermal expansion coefficient. The carbon fiber itself, however, can hardly enjoy those characteristics since it is a very fine string-like element having a diameter of about several micrometers. The carbon fiber also has poor electric and thermal conductivities. Therefore, there has been used a composite structure formed by embedding carbon fibers in a copper matrix which has a large thermal expansion coefficient but high electric and thermal conductivities. Such a composite structure have an improved mechanical strength as well as the excellent characteristics of both the carbon fiber and the copper metal.

Such a composite structure may be used as sliding members in rotary machines such as slip rings or commutators, or as sliders for pantographs on electric cars because the composite structure has a high electric conductivity, a mechanical strength and resistivities to heat and abrasion. The composite structure may be also used as electrodes for semiconductor devices because it has a small thermal expansion coefficient, a high electric conductivity and a high thermal conductivity.

The content of carbon fibers to be contained in the composite structure, the orientation of the fibers in the composite material, the applications of the composite structure, especially a method of joining the composite structure to another structure may be freely changed or selected depending on the purposes of use. One joining method may be a junction through a brazing material. For example, in the case of a pantograph, a slider made of a composite structure containing carbon fibers embedded in a copper matrix in one direction may be secured through a brazing material to the collector shoe. In the case of a semiconductor device, a semiconductor substrate having one or more PN junctions serving as diode, transistor and/or thyristor functions may be secured through a brazing material to a supporting electrode made of a composite structure containing carbon fibers embedded in a copper matrix spirally, as shown in U.S. Pat. No. 3,969,754.

In the case of slip-rings, commutators or sliders, since they are subjected to vibrations, the joint between the composite structure and the supporting member must be rigid enough. Also, in the case of semiconductor devices, the joint between the semiconductor substrate and the supporting electrode of the composite structure must be rigid to lower the forward voltage drop FVD.

However, the composite structure of copper matrix and carbon fibers cannot form a firm junction with a brazing material owing to the contained carbon, thereby providing a sufficient mechanical strength.

Especially, in the case of semiconductor devices, the incomplete joint causes the increase in the forward voltage drop FVD and moreover the copper atoms may penetrate into the semiconductor substrate through the brazing material to form a brittle compound with the semiconductor material such as silicon. If the compound is subjected to a heat cycle, thermal fatigue grows in it so that not only mechanical strength but also electrical properties will be deteriorated. In the case where Al brazer is used as a brazing material, aluminum and copper form an alloy and further the copper matrix undergoes abnormal corrosion and is deformed so that voids are generated in the alloy, thereby degrading the capacity of heat dissipation and the rigidity of joint portion and increasing the forward voltage drop FVD. Moreover, the formation of the copper-aluminum alloy causes mechanical stress which lowers the mechanical strength.

One object of this invention is to provide a composite joint system including a composite structure containing carbon fibers embedded in a copper matrix, in which there are eliminated harmful influences which may be caused in joining the composite structure to another structure through a brazing material.

Another object of this invention is to provide a composite joint system in which a composite structure containing carbon fibers embedded in a copper matrix is firmly joined to another structure through a brazing material.

Yet another object of this invention is to provide a composite joint system in which a composite structure containing carbon fibers embedded in a copper matrix is joined to a semiconductor substrate through a brazing material while keeping the electric and mechanical characteristics.

According to this invention, there is provided a composite joint system in which a composite structure containing carbon fibers embedded in a copper matrix is joined through a brazing material to a member to be secured to said composite structure, wherein between said composite structure and said brazing material is interposed a film of metal which prevents the direct contact of said brazing material with said composite structure and has a good wettability to both the composite structure material and said brazing material.

The above and other objects and features of this invention will be better understood from the following detailed description taken in conjunction with the accompanying drawings, in which:

BRIEF DESCRIPTION OF THE DRAWINGS

As shown in FIG. 1, a pantograph 1 is mounted on the roof of an electric car 2 and the collector 4 of the pantograph 1 is kept in contact with an aerial line or conductor 3. A pair of sliders 6 are mounted on the collector shoe 5 of the collector 4, as shown in FIG. 2. The collector shoe 5 is usually made of an aluminum alloy since it must be of small weight to improve the indirect contact with the aerial line 3. On the other hand, the sliders 6 kept in direct contact with the aerial line 3 are usually made of material containing copper. Since the sliders 6 are the parts that are worn out and need exchange for new ones when they are worn out, the sliders 6 are usually fastened to the collector shoe 5 by means of bolts 70.

As shown in FIG. 3, the slider 6 includes a sliding member 7 made of a composite structure containing carbon fibers embedded in a copper matrix and a supporting member 8 of a highly conductive material such as copper. The members 7 and 8 are joined together by means of a brazing material 10 and a Cr film 9 having a thickness of about 1 to 50 $\mu$m. The metal film 9 is provided on the junction surface of the sliding member 7.

Figure 1:
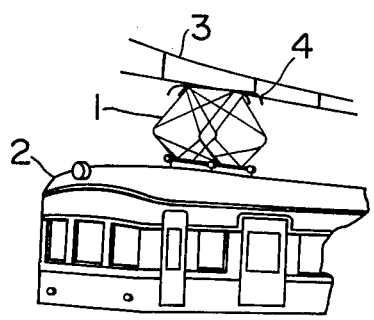
FIG. 1 schematically shows a part of an electric car with a pantograph.
Figure 2:
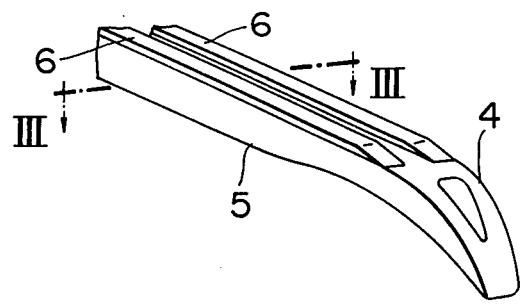
FIG. 2 shows on enlarged scale a part of the collector shoe of a pantograph to which this invention is applied.

A preferred example of producing the sliding member 7 is as follows. Carbon powder having a purity of 99.9% and a grain size of 325 meshes and copper powder having a particle diameter of 2 $\mu$m are mixed with a water solution of 3% methylcellulose having a weight equal to about twice the weight of the carbon and copper powders together. The mixture is agitated by an agitator to prepare a slurry. On the other hand, there is prepared a stack of carbon fibers with filaments each having a diameter of 9 $\mu$m and plated with a copper film having a thickness of about 0.2 $\mu$m. These carbon fibers are immersed into the carbon-copper slurry and the carbon fibers are impregnated with the slurry. The slurry-impregnated carbon fibers are then put into a hot-press mold with all the carbon fibers aligned in one direction and is subjected to the hot press under pressure of 300 kg/cm$^2$ at 800° C. in the atmosphere of H$_2$ gas to produce a composite structure of copper and carbon fibers containing 20 volume % of copper and 30 volume % of carbon powder. The thus produced composite structure has an electric conductivity of 45 IACS % and a tensile strength of 39 kg/mm$^2$. With this composite structure, the abrasion rates of the aerial conductor 3 and the sliding member 7 are both small.

Though the carbon fibers in the composite structure have been aligned in one direction, the carbon fibers may be arranged in any configuration, e.g. in random directions, in mesh form, spirally or radially.

The metal film 9 may be made of at least one selected from Ni, Cr, Mo, W, Ta, Ti, Zr, V and an alloy of one or some of such metals and may be multi-level film formed by the combination of some thereof. The metal film 9 may be provided by well known techniques such as plating, vacuum evaporation, sputtering, ion-plating, chemical vapor deposition or fusion spray.

Al brazer providing a high mechanical strength is preferable as the brazing material 10. However, when the Al brazer is used, Ni should not be used as the metal film material since aluminum and nickel form alloy through an intense reaction so that a firm joint cannot be formed. Though Ag brazer and solder are inferior in mechanical strength to the Al brazer, they can be used together with a Ni film. If the metal film 9 is a composite or multi-layer film including a Ni film and a film of another metal thereon in contact with the brazing material layer, the Al brazer can be used.

The presence of the metal film 9 prevents the direct contact of the sliding member 7 with the brazing material 10 and the metal film 9 also has a good wettability with both the composite structure material (copper matrix and carbon fibers) and the brazing material, so that the sliding member 7 and the supporting member 8 can be firmly joined together.

The firm joint over the entire junction surface of the sliding member 7 improves the electric conductivity between the sliding member 7 and the supporting member 8. The metal film 9 hardly increases electric resistance since its thickness can be made small enough without damaging its function. In connection with the provision of a metal film on the sliding member, reference may be made to Japanese Utility Model Publication No. 18731/73 showing a pantograph structure in which a slider of copper and a collector shoe of aluminum alloy are fastened by means of a bolt, a layer of metal such as Zn being coated on one surface of the slider to which the collector shoe is attached and on the inner wall of a hole of the slider into which the bolt is inserted, thereby preventing the corrosion of the collector shoe.

Figure 4:
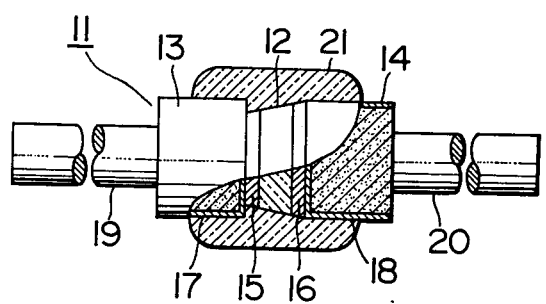
FIG. 4 shows in partial cross section a glass mold type diode to which this invention is applied.

FIG. 4 generally shows a glass mold type diode 11 to which this invention is applied. A silicon chip 12 having a PN junction is interposed by means of Al brazer layers 15 and 16 between a pair of electrodes 13 and 14 made of a composite structure containing carbon fibers embedded in a copper matrix. The junction surfaces of the electrodes 13 and 14 facing the silicon chip 12 is provided with W films 17 and 18 and the other surfaces of the electrodes are provided with Cu leads 19 and 20. This arrangement is molded with glass 21 from one electrode to the other so as to passivate the exposed edges of the PN junction of the silicon chip 12 and to prevent the chip 12 from being injured by external forces.

A preferred example of producing the electrodes 13 and 14 is as follows. Carbon fibers with filaments each having a diameter of about 9 $\mu$m and plated with a copper film having a thickness of about 1 $\mu$m are arranged spirally and after the spirally arranged carbon fibers have been impregnated with a slurry composed of copper powder and methylcellulose, the slurry-impregnated carbon fibers are subjected to hot-press under pressure of 200 kg/cm$^2$ at 1000° C. in the atmosphere of H$_2$ gas to produce a composite structure of copper and carbon fibers containing 30 volume % of carbon fibers and 70 volume % of copper. The spiral arrangement of the carbon fibers is so employed as to eliminate anisotropy in orientation. The same effect may also be achieved by employing a random arrangement of the carbon fibers. In the case where such a composite structure is used as an electrode for a semiconductor substrate, the composite structure should preferably contain carbon fibers within a range of 10–40 volume %. For the composite structure having such a composition has a thermal expansion coefficient approximately equal to that of the semiconductor material so that no thermal stress is generated due to joining the electrode to the semiconductor substrate.

Though the carbon fibers have been arranged spirally, the carbon fibers may be arranged in any configuration, e.g. in one direction, in random directions, in mesh form or radially.

The W films 17 and 18 having a thickness of at least 1 $\mu$m may be formed by well known techniques such as plating, vacuum-evaporation, sputtering, ion-plating, chemical vapor deposition or fusion spray.

The metal film 17 or 18 may be made of at least one selected from Ni, Cr, Mo, V, Ta, Ti, Zr, V and an alloy of one or some of such metals and may be a composite or multi-layer film formed by the combination of some thereof. The metal film should have a thickness of at most 50 $\mu$m since it serves to eliminate the direct contact of the brazing material with the composite structure and since it must not increase the electric resistance between the electrode and the semiconductor substrate.

It is also preferable to provide a Cu film having a thickness of at least 15 $\mu$m between the electrode 13 or 14 and the metal film 17 or 18 so as to eliminate strain generated due to the provision of the metal film 17 or 18 and to prevent cracks from taking place in the metal film 17 or 18 due to thermal impacts at grazing, glass-molding and/or annealing for improving the contact between the electrode 13 or 14 and the metal film 17 or 18.

The electrodes 13 and 14 are joined respectively to the leads 19 and 20 by precussion welding, but they may also be joined by means of brazing material. The leads 19 and 20 may be of any material, instead of copper, which can be joined to the electrodes 13 and 14 made of the composite structure of copper matrix and carbon fibers. For example, a Cu lead containing Zr to increase hardness may be used.

The leads 19 and 20 are joined to the electrodes 13 and 14 provided with the metal films 17 and 18 while the brazing material layers 15 and 16 are provided on the main surfaces of the silicon chip 12 having a PN junction formed by a well known impurity diffusion technique. The electrode 13 and the silicon chip 12 and the electrode 14 are disposed in this order mentioned on a jig (not shown) and subjected to heat treatment so that the silicon chip 12 is rigidly supported between the electrodes 13 and 14. Thereafter, the silicon chip 12 is subjected to etching treatment to clean its surface and then molded with glass 21.

The mold of glass 21 is made in such a manner that a slurry composed of ethyl alcohol and fine powder of glass of $ZnO-B_2O_3-SiO_2$ system having a surface passivation function is applied to the assembly of the silicon chip 12 and the electrodes 13 and 14 and the slurry-applied assembly is then passed through a furnice for sintering and molding.

The presence of the metal films 17 and 18 assures the firm joint between the electrodes 13 and 14 and the silicon chip 12 through the brazing material layers 15 and 16. The metal films 17 and 18 also prevent the direct contact of the electrodes 13 and 14 with the brazing material layers 15 and 16. Accordingly, copper atoms are prevented from diffusing into the semiconductor substrate, i.e. silicon, so that the reaction of copper and silicon to form an undesirable brittle compound does not take place. Therefore, mechanical and electrical properties are by no means degraded. Moreover, the presence of the metal films 17 and 18 prevents aluminum in the brazing material layers 15 and 16 from corroding copper in the electrodes 13 and 14 so that the capacity of heat dissipation is not decreased, the forward voltage drop FVD is not increased and the joining strength is not deteriorated.

It is also preferable to use Al brazer containing Si as the brazing material. For the Al-Si brazer has a lower melting point than the brazer of pure Al so that the thickness of the metal films 17 and 18 can be lessened where the Al-Si brazer is used. Pure aluminum has a melting point of about 770° C., but Al brazer containing 15 weight % of Si has a melting point of about 640° C. It therefore suffices to provide the films 17 and 18 of Mo having a thickness of 0.5 μm when the Al brazer containing 15 weight % of Si is used while the thickness of the Mo films 17 and 18 must be 1 μm for the brazer of pure Al. The smaller the thickness of the metal films 17 and 18, the shorter becomes the time required to form them.

Now, the case will be described where the metal films 17 and 18 of Ti having a thickness of 1.5 μm is formed by ion-plating. The film fromed by the ion-plating technique has an excellent coverage over the plated members, i.e. the electrodes 13 and 14 so that Ti atoms conveniently penetrate between the copper matrix and the carbon fibers of the electrodes 13 or 14 to form a firm junction between the metal films 17 or 18 and the electrodes 13 or 14. If the carbon fibers are exposed in the junction surfaces of the electrodes 13 and 14, a compound of titanium carbide is formed during heating treatment at 700° C. so that the electrodes 13 and 14 and the metal films 17 and 18 are joined together more firmly. Since the formation of the titanium-carbon alloy causes the decrease in the thickness of the plated Ti film, the film of Ti must be made thicker than the film of metal other than Ti. Therefore, the thickness of the Ti film is 1.5 μm in a preferred example.

As described above, Al brazer or Al alloy brazer forms alloy with Ni through an intense reaction so that desired results can hardly be obtained. Also, Ni has a poor wettability to glass. Therefore, when Ni is used for the metal film, it should be externally coated with a film of another metal other than Ni to form a composite or multi-layer film. As the metal other than Ni is selected any one which is wettable to glass and therefore has a satisfactory effect of hermetically sealing the silicon chip 12. In place of the Al or Al-Si brazer, a well known brazer such as Ag brazer, solder, Au-Sb brazer or Au-Sn brazer may be used as the brazing material 15 or 16.

Though FIG. 4 shows an example in which a single silicon chip 12 is used, more than one silicon chips may be used. For example, this invention is applicable to a diode as shown in U.S. Pat. No. 3,913,127 in which a lamination of plural silicon chips bonded through brazer layers is sandwiched between a pair of electrodes and the periphery of the sandwiched lamination is molded with glass. In that case, if each of the electrodes is made of such a composite structure of copper matrix and carbon fibers and metal films are respectively provided on the junction surfaces of the electrodes to which the silicon chip lamination is joined, as described in connection with FIG. 4, the same effects as in the embodiment of FIG. 4 can be attained.

Figure 5:
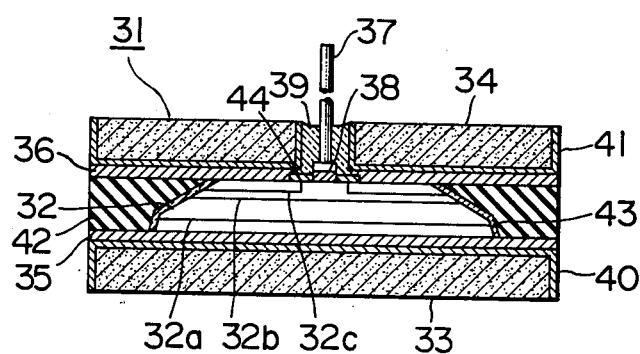
FIG. 5 shows in longitudinal cross section a power thyristor to which this invention is applied.

FIG. 5 generally shows a power thyristor to which this invention is applied. A semiconductor substrate 32 having opposite side faces inclined at different angles and including four semiconductor layers of alternate conductivity types P and N. Three PN junctions 32a to 32c are formed between adjacent semiconductor layers. The first and second PN junctions 32a and 32b have their edges exposed to the peripheral side faces of the semiconductor substrate 32 and the third PN junction 32c has its outer edge exposed to the peripheral side faces of the substrate 32 and its inner edge exposed in annular configuration to the top surface of the substrate 32. Electrodes 33 and 34 made of a composite structure of copper matrix and carbon fibers as described in connection with FIG. 4 are joined to the top and bottom surfaces of the semiconductor substrate 32 by means of brazing material layers 35 and 36. The top electrode 34 has an annular shape and a gate electrode 37 is led out through the opening of the annular electrode 34. The gate electrode 37 is joined by a brazing material layer 38 to the second semiconductor layer which protrudes like a plateau through the top or first semiconductor layer and exposed in the top surface. The gap between the gate electrode 37 and the top electrode 34 is hermetically filled with glass 39. Metal films 40 and 41 of Cr are respectively provided between the bottom electrode 33 and the brazing material 35 and between the top electrode 34 and the brazing material 36, according to this invention.

Figure 3:
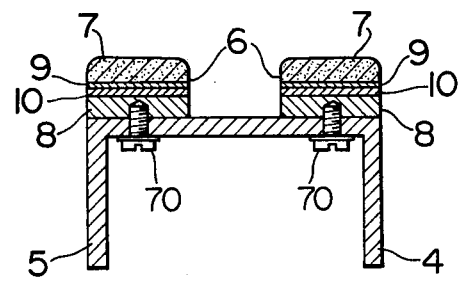
FIG. 3 is a cross section taken along line III—III in FIG. 2.

As described in connection with FIGS. 3 and 4, the metal film 40 or 41 may be made of at least one selected from Ni, Cr, Mo, W, Ta, Ti, Zr, V and an alloy of one or some of such metals and may be a composite or multi-layer film formed by the combination of some thereof.

An annular insulator 42 such as ceramic is provided to the peripheral side faces of the semiconductor substrate 32 and between the top and bottom electrodes 33 and 34 to hermetically seal the substrate 32. If the insulator 42 has a poor wettability to the brazing material layers 35 and 36, the junction surfaces of the insulator 42 may be conveniently metalized with metal such as Cu which is wettable to the brazers 35 and 36.

An example of a brazer having a good adhesiveness to both silicon and ceramic is Pb-Sn solder containing a very small quantity of Zn, Sb, Ti, Si Al and Cu. This solder functions as a hermetically sealing material as well as brazer so that it is preferable for the hermetical sealing with the insulator 42. The Pb-Sn solder is available under a trade name of "Cerasolzer" from Asahi Glass Co., Ltd, in Japan.

The space between the substrate 32 and the insulating material 42 is filled with glass 43 of $ZnO-B_2O_3-SiO_2$ system formed by sintering and having a function of passivating the edges of the first to third PN junctions 32a to 32c. The edge of the third PN junction 32c exposed to the top surface is coated with a passivation film 44 of $SiO_2$.

By adjusting the composition of the electrodes 33 and 34, the thermal expansion coefficient of the electrodes 33 and 34 can be made equal to that of the silicon substrate 32 so that no thermal stress is generated. Also, the metal films 40 and 41 assure the firm joint between the electrodes 33, 34 and the semiconductor substrate 32 so that a power thyristor having a substrate with a diameter as large as 70 mm can be fabricated in a simple package structure as shown in FIG. 5. In connection with the package power thyristor of FIG. 5, reference may be made to Japanese Patent Application Laid-Open No. 7026/71 which corresponds to U.S. Application Serial No. 39,937 filed on May 22, 1970 and which shows a packaged power thyristor similar to that of FIG. 5 except that no meal film is interposed between the semiconductor substrate and the supporting electrode and the supporting electrode is made of usual refractory metal.

Though this invention has been described and shown in conjunction with the case where the slider of a pantagraph is joined to the collector shoe and the case where a semiconductor substrate is joined to the supporting electrodes, it should be understood that this invention is widely applicable to any case where a composite structure of copper matrix and carbon fibers is jointed to another structure through a brazing material.

What is claimed is

1. A composite joint system having a composite structure containing a plurality of carbon fibers embedded in a copper matrix, said composite structure being joined through a brazing material to a member to be secured to said composite structure, wherein said brazing material is Al, and wherein between said composite structure and said brazing material is interposed a film of metal which prevents the direct contact of said brazing material with said composite structure and has a good wettability to both the composite structure material and said brazing material, said metal film including a first layer of Ni provided on said composite structure and a second layer of at least one selected from a group consisting of Cr, Mo, W, Ta, Ti, Zr, V, and an alloy of at least one of these metals and provided on said first layer.

2. A composite joint system according to claim 1 wherein said metal film has a thickness of about 1–50 μm 3. A composite joint system having a composite structure containing a plurality of carbon fibers embedded in a copper matrix, the composite structure being joined through a brazing material to a member to be secured to said composite structure, wherein said brazing material is an Al brazing material, and wherein between said composite structure and said brazing material is interposed a film of metal which prevents the direct contact of said brazing material with said composite structure and has a good wettability to both the composite structure and said brazing material, said metal film including a first layer of Ni provided on said composite structure and a second layer of at least one selected from a group consisting of Cr, Mo, W, Ta, Ti, Zr, V and an alloy of at least one of these metals and provided on said first layer.

4. A composite joint system according to claim 3, wherein said Al brazing material is an Al alloy.

5. A composite joint system according to claim 3, wherein said Al brazing material is Al-Si.

* * * * *